(12) United States Patent
Isobe et al.

(10) Patent No.: US 6,337,834 B1
(45) Date of Patent: Jan. 8, 2002

(54) SYNCHRONOUS SIGNAL GENERATION CIRCUIT

(75) Inventors: Katsuaki Isobe, Kawasaki; Hironobu Akita, Yokohama; Satoshi Eto, Yokohama; Haruki Toda, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/706,842

(22) Filed: Nov. 7, 2000

(30) Foreign Application Priority Data

Nov. 15, 1999 (JP) ............................................. 11-324201

(51) Int. Cl.$^7$ .................................................. G11C 8/00
(52) U.S. Cl. ....................................... 365/233; 365/210
(58) Field of Search ................................ 365/233, 226, 365/227, 191, 210

(56) References Cited

U.S. PATENT DOCUMENTS

| | | | |
|---|---|---|---|
| 5,867,432 A | | 2/1999 | Toda |
| 5,991,231 A | * | 11/1999 | Koshikawa .................. 365/233 |
| 6,188,637 B1 | * | 2/2001 | Ooishi ......................... 365/233 |

OTHER PUBLICATIONS

Atsushi Hatakeyama, et al., "A 256Mb SDRAM Using a Register–Controlled Digital DLL", ISSCC Digest of Technical Papers, pp. 72–73, Feb. 1997.

* cited by examiner

Primary Examiner—David Nelms
Assistant Examiner—Thong Le
(74) Attorney, Agent, or Firm—Banner & Witcoff, Ltd.

(57) ABSTRACT

The present invention provides a synchronous signal generation circuit that can be operated with a high accuracy, at a high speed and with a low power consumption without being affected by the process dispersion. The synchronous signal generation circuit of the present invention comprises a real circuit including an input receiver, an off-chip driver, and a mirror-type synchronous circuit, and a dummy circuit for determining the delay time in the mirror-type synchronous circuit, the dummy circuit including an input receiver and an off-chip driver. In the dummy circuit, the input signal is supplied first to the off-chip driver and, then, to the input receiver so as to permit the signal between the off-chip driver and the input receiver to be a small amplitude signal. It follows that the real circuit and the dummy circuit are equal to each other in the signal levels in the input and output portions of each of the input receiver and the off-chip driver. The particular construction makes it possible to minimize the error in the delay time between the real circuit and the dummy circuit relative to the process dispersion so as to improve the synchronizing accuracy and, thus, to achieve a high speed I/O.

24 Claims, 4 Drawing Sheets

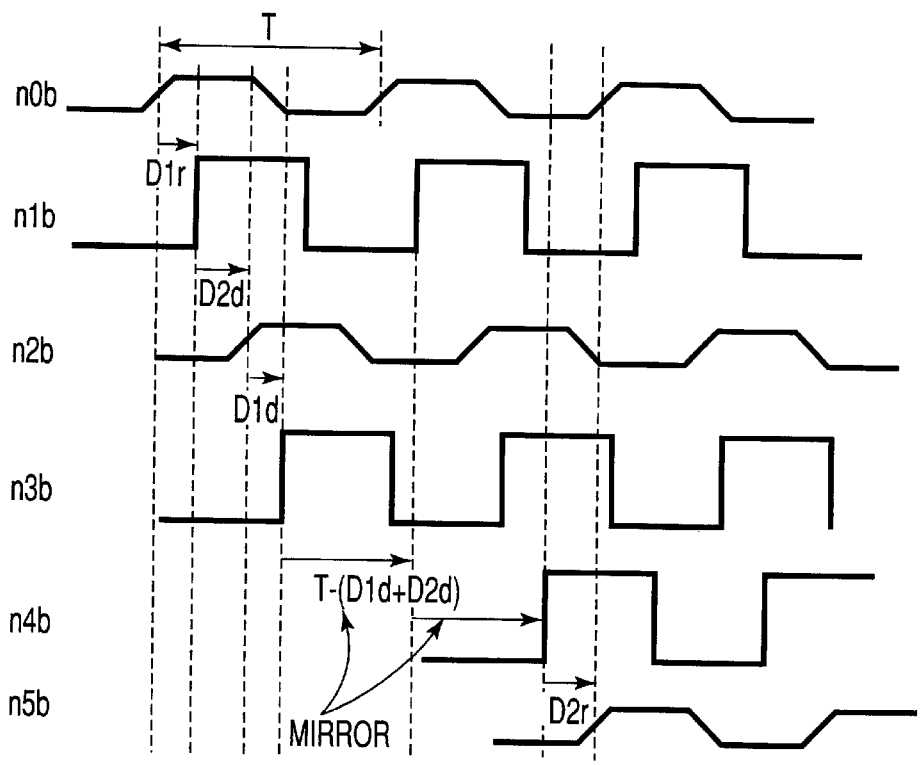
F I G. 4
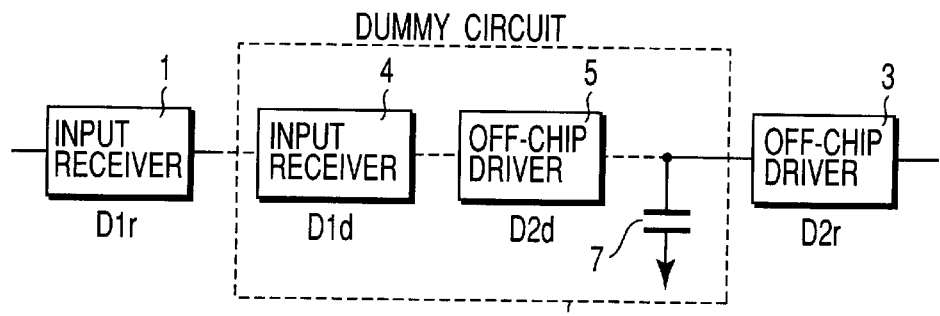
F I G. 5
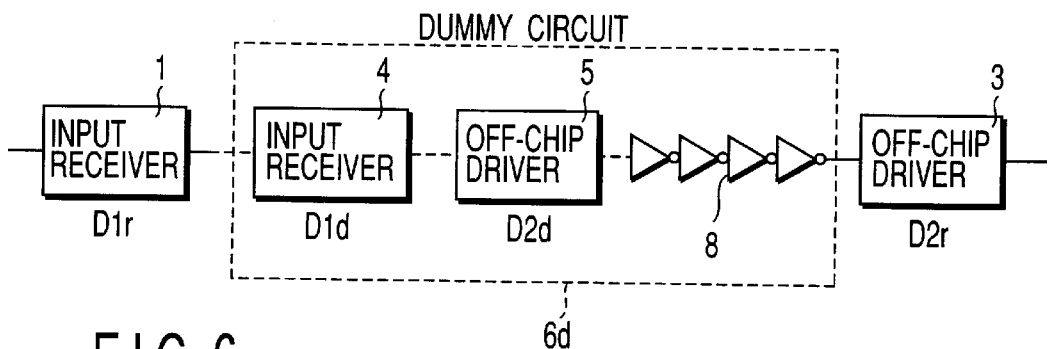
F I G. 6

SYNCHRONOUS SIGNAL GENERATION CIRCUIT

CROSS-REFERENCE TO RELATED APPLICATIONS

This application is based upon and claims the benefit of priority from the prior Japanese Patent Application No. 11-324201, filed Nov. 15, 1999, the entire contents of which are incorporated herein by reference.

BACKGROUND OF THE INVENTION

The present invention relates to a synchronous signal generation circuit, particularly, to a synchronous signal generation circuit generating an internal clock signal in synchronism with an external clock signal supplied at a predetermined period, said internal clock signal being used for a high speed data transfer.

A In a conventional synchronous signal generation circuit, an internal clock signal is generated in synchronism with an external clock signal supplied to a memory device for use in a high speed data transfer. Since delay occurs in a circuit such as, for example, an input receiver in the input stage and in a circuit such as, for example, an off-chip driver in the output stage, the delay is corrected by using a synchronous circuit within the memory device.

FIG. 1 shows the construction of a conventional synchronous signal generation circuit including a mirror-type synchronous circuit as a main portion.

The synchronous signal generation circuit shown in FIG. 1 comprises a real circuit including an input receiver 1, a mirror-type synchronous circuit 2 and an off-chip driver 3 and a dummy circuit 6a surrounded by a dotted line and including an input receiver 4 and an off-chip driver 5.

A small amplitude external clock signal n0a supplied to the memory is inputted to the input receiver 1 of the real circuit, and a large amplitude signal n1a of CMOS level is outputted from the input receiver 1. In this case, a delay time D1r occurs within the input receiver 1.

The large amplitude signal n1a of CMOS level is branched so as to be supplied both to the input receiver 4 of the dummy circuit 6a and to the mirror-type synchronous circuit 2 of the real circuit. In the path of the real circuit, the signal n1a is transmitted through the mirror-type synchronous circuit 2 so as to be outputted from the mirror-type synchronous circuit 2 as a large amplitude signal n4a of CMOS level. The signal n4a is supplied to the off-chip driver 3 and is outputted from the off-chip driver 3 as a small amplitude internal clock signal n5a. A delay time Dr2 occurs within the off-chip driver 3.

In the path of the dummy circuit 6a surrounded by the dotted line, the signal n1a is supplied to the input receiver 4 of the dummy circuit 6a, and a large amplitude signal n2a of CMOS level is outputted from the input receiver 4. The signal n2a is supplied to the off-chip driver 5, and a large amplitude signal n3a of CMOS level is outputted from the off-chip driver 5 for driving the mirror-type synchronous circuit 2. In this step, a delay time D1d and another delay time D2d occur in the input receiver 4 and the off-chip driver 5, respectively.

In order to enable the synchronous signal generation circuit, which receives the external clock signal n0a, to output the internal clock signal n5a in synchronism with the external clock signal n0a, it is necessary for the sum of the delay time of the external clock signal n0a and the delay time of the internal clock signal n5a to be exactly equal to an integral multiple of the period T of the external clock signal n0a. An example, in which the sum of the delay time of the external clock signal n0a and the delay time of the internal clock signal n5a is equal to a single period, will now be described.

The input signal n1a to the input receiver 4 is transmitted through the mirror-type synchronous circuit 2 via the path of the dummy circuit 6a. In this step, the input signal n1a is triggered directly by the pulse rising edge of the pulse of the mirror-type synchronous circuit 2, with the result that the delay time in the mirror-type synchronous circuit 2 is T−(D1d+D2d).

Incidentally, it should be noted that the mirror-type synchronous circuit 2 is constructed such that the upper and lower portions have the same structure. Therefore, if the mirror-type synchronous circuit 2 is constructed such that a delay time of T−(D1d+D2d) occurs when the signal passing through the dummy circuit 6a is transmitted through the upper portion of the mirror-type synchronous circuit 2 as denoted by a broken line, a delay time when the signal passing through the real circuit joined by a solid line is transmitted through the lower portion of the mirror-type synchronous circuit 2 as denoted by an arrow of a solid line is equal to T−(D1d+D2d). It follows that the sum of the delay time in the path of the real circuit is D1r+T−(D1d+D2d)+D2r. To make the sum of the delay time noted above equal to the period T and to obtain the internal clock signal n5a in synchronism with the external clock signal n0a, it is necessary for the delay times to meet the relationship D1r+D2r=D1d+D2d. In short, the delay time of the signal transmitted through the path of the dummy circuit must be equal to the delay time of the signal transmitted through the path of the real circuit excluding the mirror-type synchronous circuit. In other words, in order to allow the internal clock signal n5a outputted from the synchronous signal generation circuit to be synchronized with the external clock signal n0a, it is necessary for the delay time in the dummy circuit to imitate completely the delay time in the real circuit. Further, in terms of the manufacturing process, it is desirable for the relationships D1r=D1d and D2r=D2d to be satisfied.

FIG. 2 is a timing wave form diagram denoting the operation of the conventional synchronous signal generation circuit. The signal n0a is a small amplitude external clock signal supplied to the input receiver 1. The period T of the wave form of the signal n0a is denoted by an arrow. The signal n1a represents the output signal generated from the input receiver 1. As shown in the drawing, the signal n1a is inputted to the input receiver 4 of the dummy circuit 6a with a delay time D1r and is outputted from the input receiver 4 as the large amplitude signal n2a of CMOS level with a delay time D1d. Further, the signal n2a is inputted to the off-chip driver 5 of the dummy circuit 6a and is outputted from the off-chip driver 5 as a large amplitude signal n3a of CMOS level with a delay time D2d.

The signal n3a is inputted to the mirror-type synchronous circuit 2. However, since the delay time of the signal n3a is set at T−(D1d+D2d), the dummy output signal (not shown) transmitted through the mirror-type synchronous circuit 2 via the dummy circuit 6a is a signal delayed from the signal n1a by a period T.

On the other hand, in the real circuit, the large amplitude output signal n1a of CMOS level generated from the input receiver 1 is inputted to the mirror-type synchronous circuit 2 in which the delay time is set at T−(D1d +D2d), and the output signal n4a generated from the mirror-type synchronous circuit 2 is inputted to the off-chip driver 3 and, then, outputted from the off-chip driver 3 as a small amplitude internal clock signal n5a with a delay time D2r.

In the timing wave form shown in FIG. 2, the delay times T−(D1d+D2d) of the mirror-type synchronous circuit after transmission of the signal through the dummy circuit 6a and during transmission of the signal through the real circuit are denoted respectively as MIRROR by arrows. It should be noted that the small amplitude internal clock signal n5a synchronized with the small amplitude external clock signal n0a is outputted from the off-chip driver 3 with the delay time D2r from the rising edge of the signal n4a. Incidentally, the timing wave form shown in FIG. 2 covers the case where D1r+D2r is equal to D1d+D2d.

As described above, in the dummy circuit 6a of the conventional synchronous signal generation circuit, the input signal is supplied first to the input receiver 4 and, then, to the off-chip driver 5. Also, the input receiver 1 of the real circuit converts the small amplitude external clock signal n0a into the large amplitude signal n1a of CMOS level, and the off-chip driver 3 of the real circuit converts the large amplitude signal n4a of CMOS level into the small amplitude internal clock signal n5a.

As described above, the signals inputted to and outputted from the mirror-type synchronous circuit 2 are large amplitude signals of CMOS level in the conventional synchronous signal generation circuit, giving rise to the problem that it is unavoidable for all the signals inputted to and outputted from the input receiver 4 and the off-chip driver 5 collectively constituting the dummy circuit 6a to be large amplitude signals of CMOS level.

As described above, the input receiver 1 and the off-chip driver 3 included in the real circuit differ from the input receiver 4 and the off-chip driver 5 collectively constituting the dummy circuit 6a in the input and output signal levels, making it impossible to form the real circuit and the dummy circuit by using the same circuits including the input and output signal levels in the conventional synchronous signal generation circuit.

Further, if the process dispersion, the power source variation, etc. are taken into account, a deviation in delay time occurs between the real circuit and the dummy circuit 6a. The deviation noted above brings about an error in synchronization between the external input clock signal and the internal clock signal outputted from the synchronous signal generation circuit.

As pointed out above, the conventional synchronous signal generation circuit was defective in that it was impossible to form the real circuit excluding the mirror-type synchronous circuit and the dummy circuit imitating the real circuit by using the same input receiver and the off-chip driver.

The present invention, which has been achieved for overcoming the above-noted problems, is intended to provide a synchronous signal generation circuit, in which the real circuit and the dummy circuit are disposed to be capable of forming the real circuit and the dummy circuit by using exactly the same input receiver and the off-chip driver including the input and output signal levels so as to suppress the occurrence of an error in the synchronization caused by the process dispersion or the power source variation.

BRIEF SUMMARY OF THE INVENTION

In the synchronous signal generation circuit of the present invention, the dummy circuit used for setting up the delay time of the mirror-type synchronous circuit is constructed such that the input order of the signal to the input receiver and to the off-chip driver is opposite to that in the conventional synchronous signal generation circuit. To be more specific, in the dummy circuit of the synchronous signal generation circuit, the off-chip driver is arranged in the front stage and the input receiver is arranged in the rear stage. In other words, the input portion of the input receiver included in the dummy circuit is connected to the output portion of the off-chip driver included in the dummy circuit.

If the dummy circuit is constructed in the particular fashion, the off-chip driver of the dummy circuit receives a large amplitude signal outputted from the input receiver of the real circuit so as to output a small amplitude signal. On the other hand, the input receiver of the dummy circuit receives the small amplitude signal outputted from the off-chip driver of the dummy circuit so as to output a large amplitude signal. The large amplitude signal outputted from the input receiver of the dummy circuit is inputted to the mirror-type synchronous circuit of the real circuit.

To be more specific, if the arrangement of the off-chip driver and the input receiver collectively constituting the dummy circuit is made opposite to that in the conventional synchronous signal generation circuit, the input receiver and the off-chip driver included in the real circuit can be used as they are, with the result that the level alignment and the delay time alignment of the signals transmitted through the real circuit excluding the mirror-type synchronous circuit and the dummy circuit can be achieved simultaneously.

According to a first aspect of the present invention, there is provided a synchronous signal generation circuit for generating an internal clock signal in synchronism with an external clock signal having a predetermined period, comprising:

a real circuit including a first input receiver for receiving the external clock, a mirror-type synchronous circuit, and a first off-chip driver for outputting the internal clock signal, which are connected in series; and a dummy circuit for determining a delay time in the mirror-type synchronous circuit, the dummy circuit including a second input receiver and a second off-chip driver coupled between the first input receiver and the mirror-type synchronous circuit;

wherein an input portion of the second input receiver is connected to an output portion of the second off-chip driver in the dummy circuit.

In the synchronous signal generation circuit of the present invention, it is desirable for the signal levels of the input signals to the first and second input receivers to be equal to each other, for the signal levels of the output signals of the first and second input receivers to be equal to each other, for the signal levels of the input signals to the first and second off-chip drivers to be equal to each other, and for the output signals from the first and second off-chip drivers to be equal to each other.

Also, in the synchronous signal generation circuit of the present invention, it is desirable for the signal levels of the input signals to the first and second input receivers to be smaller than the signal levels of the output signals from the first and second input receivers.

Also, in the synchronous signal generation circuit of the present invention, it is desirable for the signal levels of the input signals to the first and second off-chip drivers to be larger than the signal levels of the output signals from the first and second off-chip drivers.

Also, in the synchronous signal generation circuit of the present invention, it is desirable for the signal levels of the input signals to the first and second input receivers to be smaller than the signal levels of the output signals from the first and second input receivers, for the signal levels of the input signals to the first and second off-chip drivers to be larger than the signal levels of the output signals from the first and second off-chip drivers.

Also, in the synchronous signal generation circuit of the present invention, it is desirable for the first and second input receivers to be equal to each other in the method of connecting the circuit elements and for the first and second off-chip drivers to be equal to each other in the method of connecting the circuit elements.

Also, in the synchronous signal generation circuit of the present invention, it is desirable for the gradient of the output signal rise of the second input receiver to be set optionally.

Also, in the synchronous signal generation circuit of the present invention, it is desirable for the gradient of the output signal rise of the second off-chip driver to be set optionally.

Also, in the synchronous signal generation circuit of the present invention, it is desirable for the gradient of the output signal rise of the second input receiver to be set optionally, and for the gradient of the output signal rise of the second off-chip driver to be set optionally.

Also, in the synchronous signal generation circuit of the present invention, it is desirable for the first off-chip driver in the real circuit to comprise a circuit including at least a p-channel transistor having a gate width Wpr, an n-channel transistor having a gate width Wnr, a resistor having a resistance Rr, and a capacitor having a capacitance Cr, and for the second off-chip driver in the dummy circuit to comprise a circuit including a p-channel transistor having a gate width Wpd, an n-channel transistor having a gate width Wnd, a resistor having a resistance Rd, and a capacitor having a capacitance Cd, wherein the circuits are constructed to meet relationships Wpd=Wpr/a, Wnd=Wnr/a, Rd=Rr×a, and Cd=Cr/a, where the scaling ratio "a" is larger than 1, i.e., a>1.

Also, in the synchronous signal generation circuit of the present invention, it is desirable for each of the first and second off-chip drivers to comprise a p-channel transistor, an n-channel transistor, a first resistor, a second resistor, and a capacitor, wherein a first power source voltage is imparted to the source of the p-channel transistor, the drain of the p-channel transistor is connected to the drain of the n-channel transistor, a second power source voltage is imparted to the source of the n-channel transistor, the drains of the p-channel transistor and the n-channel transistor, which are connected to each other, are connected to one terminal of the first resistor, the other terminal of the first resistor is connected to one terminal of the second resistor, a voltage that is a half of the first power source voltage is imparted to the other terminal of the second resistor, the connection point between the other terminal of the first resistor and one terminal of the second resistor is connected to one terminal of the capacitor, and a second power source voltage is imparted to the other terminal of the capacitor, each of the first and second off-chip drivers comprises an input section comprising the gate of the p-channel transistor and the gate of the n-channel transistor and an output section including the connection point of the other terminal of the first resistor, one terminal of the second resistor, and one terminal of the capacitor, and each of the first and second off-chip drivers is constructed to meet relationships Wpd=Wpr/a, Wnd=Wnr/a, Rd=Rr×a, and Cd=Cr/a, where wpr represents the gate width of the p-channel transistor included in the first off-chip driver, Wnr represents the gate width of the n-channel transistor included in the first off-chip driver, Rr represents the resistance of each of the first and second resistors included in the first off-chip driver, Cr represents the capacitance of the capacitor included in the first off-chip driver, wpd represents the gate width of the p-channel transistor included in the second off-chip driver, Wnd represents the gate width of the n-channel transistor included in the second off-chip driver, Rd represents the resistance of each of the first and second resistors included in the second off-chip driver, Cd represents the capacitance of the capacitor included in the second off-chip driver, and the scaling ratio "a" is larger than 1, i.e., a>1.

Further, in the synchronous signal generation circuit of the present invention, it is desirable for each of the first and second off-chip drivers to comprise a p-channel transistor, an n-channel transistor, a resistor and a capacitor, wherein a first power source voltage is imparted to the source of the p-channel transistor, the drain of the p-channel transistor is connected to the drain of the n-channel transistor, a second power source voltage is imparted to the source of the n-channel transistor, the drains of the p-channel transistor and the n-channel transistor, which are connected to each other, are connected to one terminal of the resistor, the other terminal of the resistor is connected to one terminal of the capacitor, and the second power source voltage is imparted to the other terminal of the capacitor, each of the first and second off-chip drivers comprises an input section including the gate of the p-channel transistor and the gate of the n-channel transistor, and an output section including the connection point of the other terminal of the resistor and one terminal of the capacitor, and each of the first and second off-chip drivers is constructed to meet relationships Wpd=Wpr/a, Wnd=Wnr/a, Rd=Rr×a, and Cd=Cr/a, where Wpr represents the gate width of the p-channel transistor included in the first off-chip driver, Wnr represents the gate width of the n-channel transistor included in the first off-chip driver, Rr represents the resistance of the resistor included in the first off-chip driver, Cr represents the capacitance of the capacitor included in the first off-chip driver, Wpd represents the gate width of the p-channel transistor included in the second off-chip driver, Wnd represents the gate width of the n-channel transistor included in the second off-chip driver, Rd represents the resistance of resistor included in the second off-chip driver, Cd represents the capacitance of the capacitor included in the second off-chip driver, and the scaling ratio "a" is larger than 1, i.e., a>1.

In the synchronous signal generation circuit of the present invention constructed as pointed out above, the delay time in the dummy circuit relative to the real circuit excluding the mirror-type synchronous circuit is rendered equal regardless of generation of the process dispersion and the power source voltage variation so as to improve the synchronizing accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 shows the timing waveform of the synchronous signal generation circuit according to the first embodiment of the present invention;

FIG. 5 shows the construction of a part of the conventional synchronous signal generation circuit used for simulation;

FIG. 6 shows another construction of a part of the conventional synchronous signal generation circuit used for simulation;

DETAILED DESCRIPTION OF THE INVENTION

Figure 1:
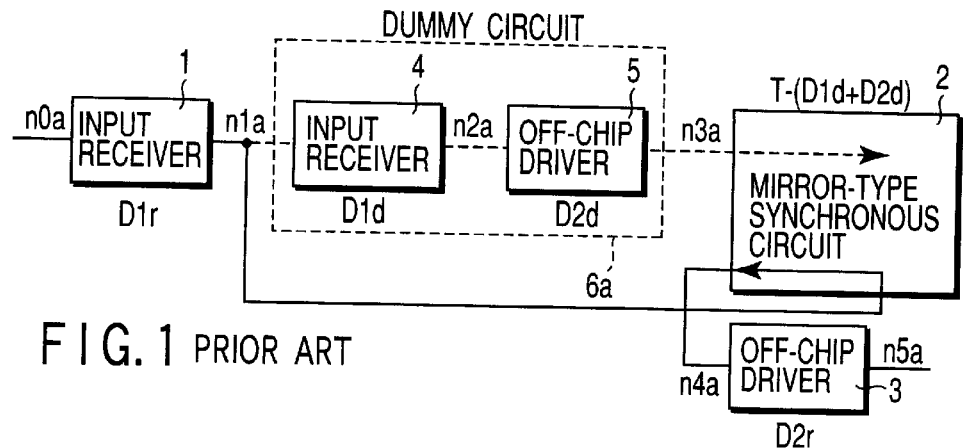
FIG. 1 shows the circuit construction of the conventional synchronous signal generation circuit.
Figure 2:
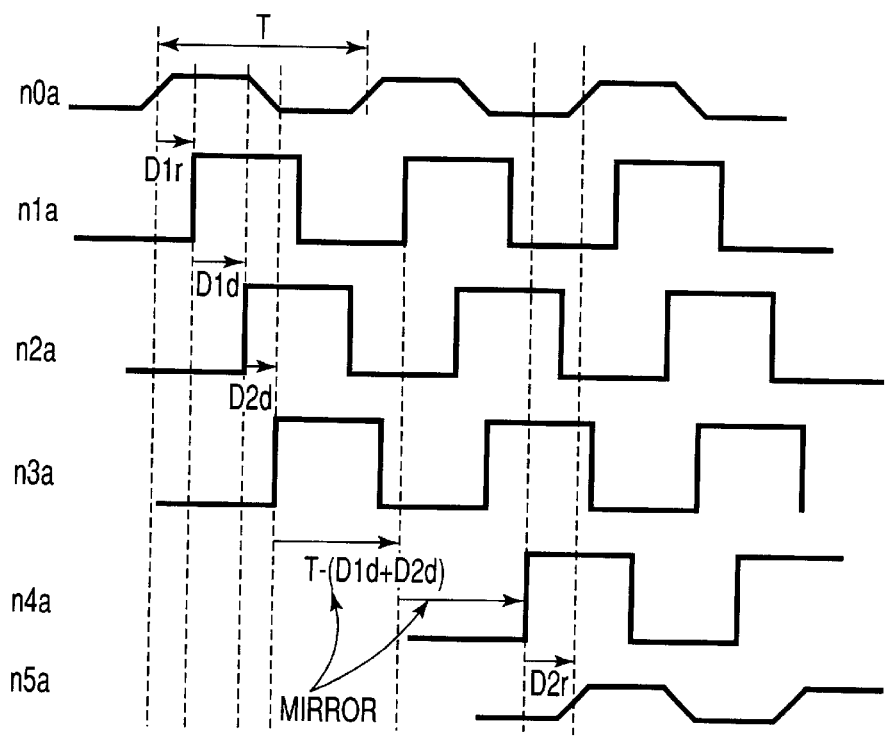
FIG. 2 shows the timing waveform of the conventional synchronous signal generation circuit.
Figure 3:
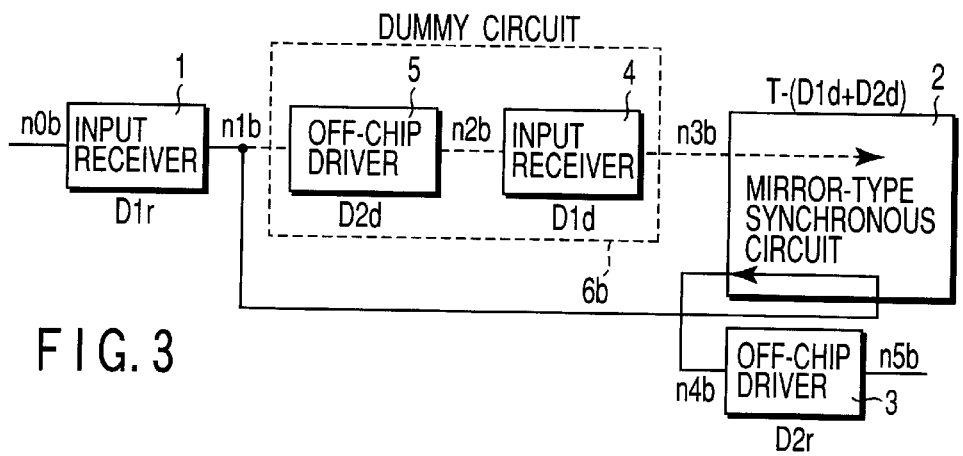
FIG. 3 shows the circuit construction of the synchronous signal generation circuit according to a first embodiment of the present invention.

Some embodiments of the present invention will now be described with reference to the accompanying drawings. Specifically, FIG. 3 shows the construction of the synchronous signal generation circuit according to a first embodiment of the present invention. The synchronous signal generation circuit shown in FIG. 3 comprises a real circuit including an input receiver 1, a mirror-type synchronous circuit 2 and an off-chip driver 3, and a dummy circuit 6b surrounded by a dotted line and including an off-chip driver 5 and an input receiver 4.

The synchronous signal generation circuit according to the first embodiment of the present invention differs from the conventional synchronous signal generation circuit in that the input receivers 1 and 4 included in the real circuit and the dummy circuit 6b, respectively, are equal to each other in construction and in the input and output signal levels, and that the off-chip drivers 3 and 5 included in the real circuit and the dummy circuit 6b, respectively, are equal to each other in construction and in the input and output signal levels.

A small amplitude external clock signal n0b inputted to the memory is inputted first to the input receiver 1 of the real circuit so as to be converted into a large amplitude signal n1b of CMOS level. In this step, the delay time in the input receiver 1 is D1r.

The large amplitude signal n1b of CMOS level is branched so as to be inputted to both an off-chip driver 5 of the dummy circuit 6b and a mirror-type synchronous circuit 2 of the real circuit. Then, within the path of the real circuit, the signal n1b is inputted to the mirror-type synchronous circuit 2 as denoted by a solid line so as to be outputted from the mirror-type synchronous circuit 2 as a large amplitude signal n4b of CMOS level. The signal n4b is inputted to the off-chip driver 3 so as to be outputted from the off-chip driver 3 as a small amplitude internal clock signal n5b. In this step, the delay time in the off-driver 3 is D2r.

In the path of the dummy circuit 6b, a large amplitude signal n1b of CMOS level is supplied to the off-chip driver 5 of the dummy circuit 6b so as to be outputted from the off-chip driver 5 as a small amplitude output signal n2b. Then, the signal n2b is supplied to the input receiver 4 so as to be outputted from the input receiver 4 as a large amplitude signal n3b of CMOS level serving to drive the mirror-type synchronous circuit 2. In this step, the delay times of the off-chip driver 5 and the input receiver 4 are D2d and D1d, respectively.

It should be noted that, in the synchronous signal generation circuit shown in FIG. 3, the input receivers 1 and 4 of the real circuit and the dummy circuit 6b are equal to each other in construction and in the input and output signal levels, as described previously. Likewise, the off-chip drivers 3 and 5 of the real circuit and the dummy circuit 6b are equal to each other in construction and the input and output signal levels. In addition, these input receivers and the off-chip drivers meet the relationships $D1r=D1d$ and $D2r=D2d$ in terms of the delay time. It follows that, if the delay time of the mirror-type synchronous circuit 2 is set at $T-(D1d+D2d)$ by using the dummy circuit 6b, it is possible to permit the internal clock signal outputted from the synchronous signal generation circuit to be synchronized perfectly with the external input clock signal.

FIG. 4 is a timing wave form diagram showing the operation of the synchronous signal generation circuit according to the first embodiment of the present invention. The symbol n0b shown in FIG. 4 represents a small amplitude external clock signal inputted to the input receiver 1. A period T of the wave form of n0b is denoted by an arrow in FIG. 4. The signal n1b is a large amplitude output of CMOS level generated from the input receiver 1. As shown in the diagram, the signal n1b is inputted to the off-chip driver 5 of the dummy circuit 6b with a delay time D1r of the input receiver 1 so as to be outputted from the off-chip driver 5 as a small amplitude signal n2b with a delay time D2d of the off-chip driver 5. The signal n2b is inputted to the input receiver 4 of the dummy circuit 6b so as to be outputted from the input receiver 4 as a large amplitude signal n3b of CMOS level with a delay time Did. Further, the signal n3b is inputted to the mirror-type synchronous circuit 2.

Since the delay time of the mirror-type synchronous circuit 2 is set at $T-(D1d+D2d)$ by using the dummy circuit 6b, the output (not shown) on the side of the dummy, which is transmitted through the mirror-type synchronous circuit 2 via the dummy circuit 6b as denoted by an arrow of a broken line, is a signal delayed by the period T from the rise of the signal n1b.

In the real circuit, a large amplitude output n1b of CMOS level generated from the input receiver 1 is supplied to the mirror-type synchronous circuit 2 in which the delay time is set at $T-(D1d+D2d)$ so as to be generated from the mirror-type synchronous circuit 2 as a large amplitude output n4b of CMOS level. Then, the signal n4b is supplied to the off-chip driver 3 of the real circuit so as to be outputted from the off-chip driver 3 as a small amplitude internal clock signal n5b with a delay time D2r.

In the wave form diagram shown in FIG. 4, the delay times T−(D1d+D2d) of the mirror-type synchronous circuit 2 after transmission through the dummy circuit 6b and during transmission through the real circuit are denoted by arrows as MIRROR. A small amplitude internal clock signal n5b in synchronism with the small amplitude external clock signal n0b is outputted from the off-chip driver 3 of the real circuit with a delay time D2r of the off-chip driver 3 from the rise of the signal n4b. In the wave form diagram shown in FIG. 4, the wave forms are shown on the basis of D1r=D1d and D2r=D2d because the input receivers 1 and 4 of the real circuit and the dummy circuit are equal to each other in construction and the input and output signal levels, and the off-chip drivers 3 and 5 of the real circuit and the dummy circuit are equal to each other in construction and the input and output signal levels, as described previously.

As described above, in the first embodiment of the present invention, the arrangement of the off-chip driver and the input receiver collectively constituting the dummy circuit are connected to each other in the order opposite to that in the conventional synchronous signal generation circuit. Also, the level alignment of the signal passing through the dummy circuit and the setting in the delay time of the mirror-type synchronous circuit using the dummy circuit are performed simultaneously by using the input receiver and the off-chip driver included in the real circuit. It follows that it is possible to provide a synchronous signal generation circuit of a high synchronizing accuracy, which permits suppressing the influences given by the process dispersion and the power source variation.

To be more specific, in the first embodiment of the present invention, the sum D1r+D2r of the delay times of the real circuit excluding the mirror-type synchronous circuit is equal to the sum D1d+D2d of the delay times of the dummy circuit. In addition, the real circuit and the dummy circuit are formed of the same combination of circuits, and the real circuit and the dummy circuit are equal to each other in the input and output signal levels. It follows that a difference in delay time between the real circuit and the dummy circuit is not brought about even if the threshold voltage, etc. of the transistor is changed by the process dispersion.

It should also be noted that the synchronizing accuracy of the synchronous signal generation circuit depends on the change in the difference in the delay time between the real circuit and the dummy circuit rather than on the absolute values of the delay times in the real circuit and the dummy circuit. It follows that the circuit construction employed in the first embodiment of the present permits improving the synchronizing accuracy.

A second embodiment of the present invention will now be described with reference to FIGS. 5 to 8. The second embodiment is directed to simulation in which studied quantitatively was the degree of improvement in the synchronizing accuracy of the conventional synchronous signal generation circuit achieved by the use of the dummy circuit described in conjunction with the first embodiment of the present invention.

FIG. 5 shows the circuit construction of the conventional synchronous signal generation circuit excluding the mirror-type synchronous circuit and comprising the input receiver 1 having the delay time D1r of the real circuit, the input receiver 4 having the delay time D1d of a dummy circuit 6c, the off-chip driver 5 having the delay time D2d of the dummy circuit 6c, a capacitor 7 for adjusting the delay time of the dummy circuit 6c, and the off-chip driver 3 having the delay time D2r of the real circuit.

FIG. 6 shows the circuit construction of the conventional synchronous signal generation circuit, which is equal to that shown in FIG. 5, except that an inverter chain 8 for correcting the delay time is inserted in the circuit shown in FIG. 6 in place of the capacitor 7 used in the circuit shown in FIG. 5 for adjusting the delay time of the dummy circuit. Since the circuits shown in FIGS. 5 and 6 are equal to each other in the other construction, the corresponding members of the circuit are denoted by the same reference numerals so as to avoid an overlapping description.

Figure 7:
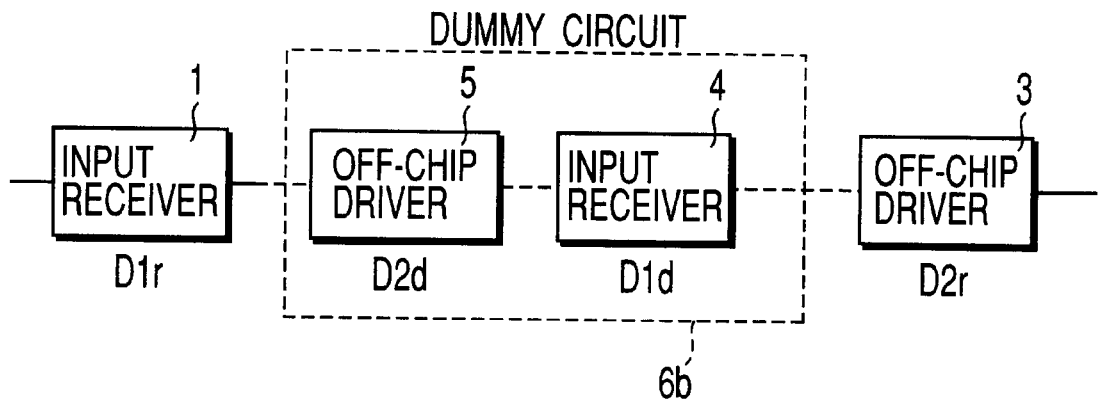
FIG. 7 shows the construction of a part of the synchronous signal generation circuit of the present invention used for simulation.

FIG. 7 shows the circuit construction comprising the input receivers 1, 4 and the off-chip drivers 3, 5 included in the synchronous signal generation circuit of the present invention. In the circuit shown in FIG. 7, the off-chip driver 5 is disposed in the front stage and the input receiver 4 is disposed in the rear stage of the dummy circuit 6b as already described in conjunction with the first embodiment of the present invention. In the construction of the conventional dummy circuits 6c and 6d shown in FIGS. 5 and 6, the capacitor 7 and the inverter chain 8 are added to the circuit, respectively. In the dummy circuit 6b of the present invention shown in FIG. 7, however, any of the capacitor and the inverter chain is not added to the circuit.

It should be noted in this connection that, in FIGS. 5 to 7, the input receiver 1 of the real circuit is equal in the circuit construction to the input receiver 4 of the dummy circuit. Also, the off-chip driver 3 of the real circuit is equal in the circuit construction to the off-chip driver 5 of the dummy circuit. However, in the construction of the conventional dummy circuits shown in FIGS. 5 and 6, a small amplitude external clock signal is inputted to the input receiver 1 of the real circuit; whereas, a large amplitude signal of CMOS level amplified by the input receiver 1 is inputted to the input receiver 4 of the dummy circuit. It follows that the delay time D1d of the input receiver 4 is shorter than the delay time D1r of the input receiver 1.

It should also be noted that, in the construction of the conventional dummy circuits shown in FIGS. 5 and 6, a small amplitude internal clock signal is outputted from the off-chip driver 3 of the real circuit; whereas, a large amplitude signal of CMOS level is outputted from the off-chip driver 5 of the dummy circuit. It follows that the delay time D2d of the off-chip driver 5 is shorter than the delay time D2r of the off-chip driver 3.

Such being the situation, in the construction of the conventional dummy circuits shown in FIGS. 5 and 6, the sum D1d+D2d of the delay times in the dummy circuit is shorter than the sum D1r+D2r of the delay times in the real circuit excluding the mirror-type synchronous circuit. The capacitor 7 shown in FIG. 5 or the inverter chain 8 shown in FIG. 6 is inserted into the circuit in order to correct the difference in the delay time.

On the other hand, in the construction of the dummy circuit of the present invention shown in FIG. 7, the off-chip driver 5 is disposed in the front stage and the input receiver 4 is disposed in the rear stage of the dummy circuit 6b as already described in conjunction with FIG. 3. It follows that it is possible to make the input and output signal levels of the off-chip driver 3 included in the real circuit equal to those of the off-chip driver 5 included in the dummy circuit. Likewise, the input and output signal levels of the input receiver 1 included in the real circuit can be made equal to those of the input receiver 4 included in the dummy circuit. As a result, a difference in the delay time is not generated between the real circuit excluding the mirror-type synchronous circuit and the dummy circuit, though such a difference is generated in the conventional circuit construction.

Figure 8:
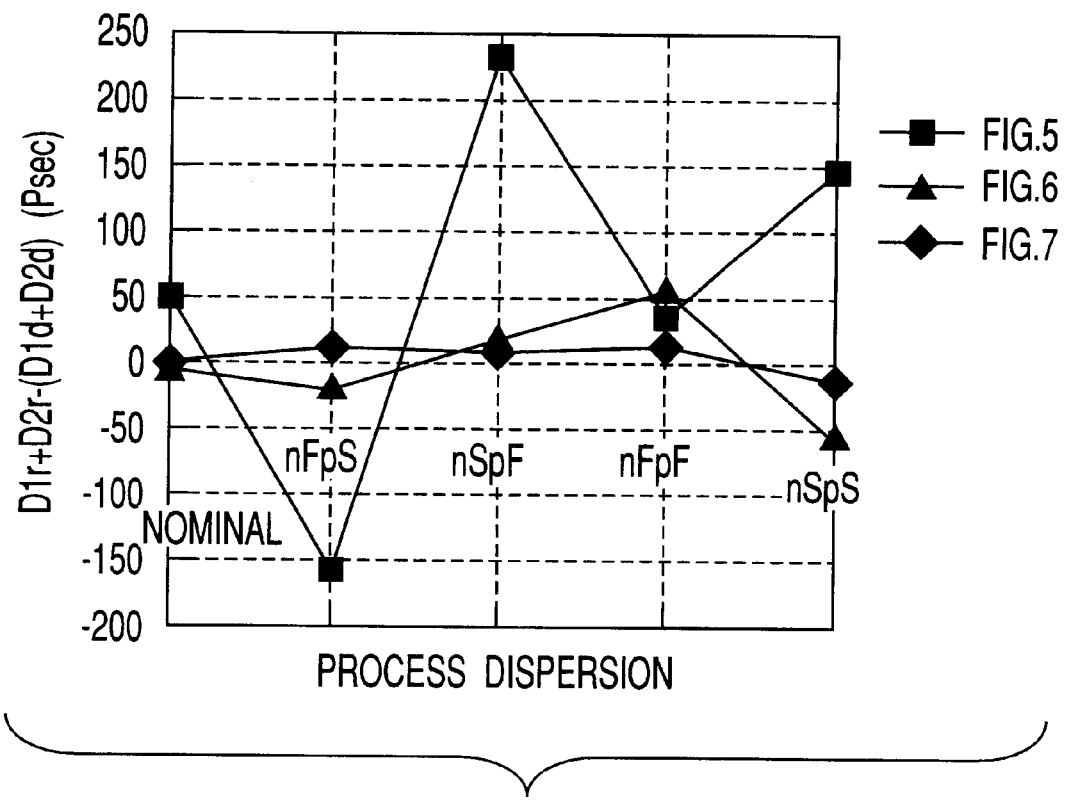
FIG. 8 is a graph showing the result of simulation.

In order to evaluate the effect given by the process dispersion to the delay time, the difference in the delay time among the circuits shown in FIGS. 5 to 7 was obtained by simulation covering the case where the design conditions of each of the n-channel transistor, hereinafter referred to as "n-ch", and the p-channel transistor, hereinafter referred to as "p-ch", were changed to nominal conditions (Nominal), high speed conditions (Fast) and low speed conditions (Slow). FIG. 8 is a graph showing the result of the simulation. The nominal conditions, the high speed conditions and the low speed conditions were prepared by changing the gate length and the threshold voltage of the transistors constituting the circuit to conform with these conditions.

In the graph of FIG. 8, the variation corresponding to the process dispersion for cases (a) to (e) given below is plotted on the abscissa:

(a) Nominal (Nominal for both n-ch and p-ch)
(b) nFpS (n-ch, Fast; p-ch, Slow)
(c) nSpF (n-ch, Slow; p-ch, Fast)
(d) nFpF (n-ch, Fast; p-ch, Fast)
(e) nSpS (n-ch, Slow; p-ch, Slow)

On the other hand, plotted on the ordinate is the difference in the delay time between the delay time $D1r+D2r$ of the real circuit excluding the mirror-type synchronous circuit and the delay time $D1d+D2d$ of the dummy circuit for FIGS. 5 to 7.

The result of the simulation shown in FIG. 8 supports that the difference in the delay time was greatly affected by the process dispersion in the construction of the dummy circuit shown in each of FIGS. 5 and 6. It is also supported that the difference in the delay time was scarcely affected by the process dispersion in the construction of the dummy circuit for the present invention shown in FIG. 7.

A third embodiment of the present invention will now be described with reference to FIGS. 9A and 9B. The third embodiment is intended to support the low power consumption of the synchronous signal generation circuit for the first embodiment. In the synchronous signal generation circuit for the first embodiment of the present invention shown in FIG. 3, the off-chip driver 3 for the real circuit is equal to the off-chip driver 5 for the dummy circuit 6b, as already pointed out.

In the dummy circuit 6b, the output of the off-chip driver 5 in the front stage is inputted directly to the input receiver 4 in the rear stage. However, the signal outputted from the off-chip driver 3 of the real circuit is outputted to the outside of the chip having a large capacitance and, thus, a large output current is required. Therefore, if the above-noted members of the dummy circuit 6b are formed of exactly the same circuit, the output current of the off-chip driver 5 in the front stage of the dummy circuit is rendered excessively large, giving rise to the problem that power is uselessly consumed within the off-chip driver 5.

Figure 9A:
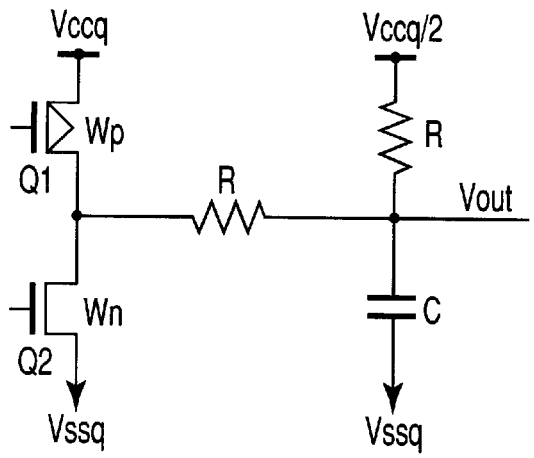
FIG. 9A exemplifies the circuit construction of the off-chip driver before scaling.

Under the circumstances, the circuit elements of the off-chip driver 3 of the real circuit shown in FIG. 9A are subjected to the scaling so as to use the circuit as the off-chip driver 5 of the dummy circuit. The scaling method will now be described.

FIG. 9A exemplifies the circuit construction of the off-chip driver 3 for the real circuit. The off-chip driver 3 shown in FIG. 9A comprises a CMOS inverter consisting of a p-channel transistor Q1 having the source connected to the power source voltage Vccq and having a gate width Wp, and an n-channel transistor Q2 having the source connected to the power source voltage Vssq (0V) and having a gate width Wn, a first resistor having one terminal connected to the drain common to the p-channel transistor Q1 and the n-channel transistor Q2 and having a resistance R, a second resistor connected between the other terminal of the first resistor and the power source voltage Vccq/2, and a capacitor C connected between the other terminal of the first resistor and the power source voltage Vssq.

The input section of the off-chip driver 3 shown in FIG. 9A is formed of the gates of the p-channel transistor Q1 and the n-channel transistor Q2. A large amplitude output signal of CMOS level from the front stage is inputted to the gates of these transistors Q1 and Q2. Also, the output section of the off-chip driver 3 consists of the connection point between the second resistor and the capacitor. A small amplitude output signal Vout is obtained from this output section.

Figure 9B:
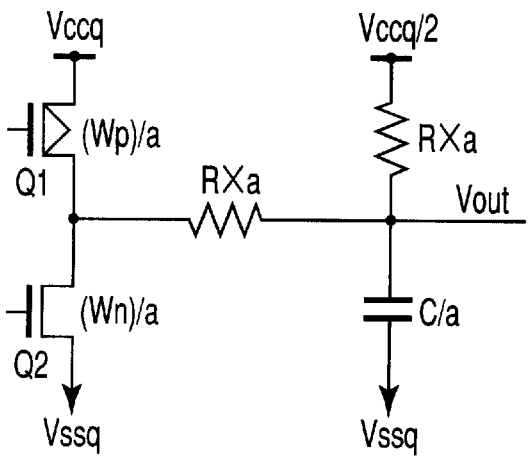
FIG. 9B exemplifies the circuit construction of the off-chip driver after scaling.

Then, the scaling is performed by using a scaling ratio "a", which is larger than 1, i.e., a>1, as shown in FIG. 9B. Specifically, the gate width of the p-channel transistor Q1 included in the CMOS inverter is diminished to wp/a. Also, the gate width of the n-channel transistor Q2 included in the CMOS inverter is diminished to Wn/a. The resistance of each of the first and second resistors is increased to R×a. Further, the capacitance of the capacitor is diminished to C/a.

In this case, the gate width of the transistor is diminished to 1/a, and the resistance is increased to a value "a" times as high as the resistance R. As a result, the current I flowing through the circuit can be suppressed to 1/a. On the other hand, since the amplitude of the output voltage Vout, which is determined by R×I, is left unchanged, it is possible to align the input and output signal levels of the off-chip driver 5 included in the dummy circuit with the input and out signal levels of the off-chip driver included in the real circuit, if the input impedance of the input receiver 4, which is connected directly to the next stage, is sufficiently high.

Also, the time constant R×C, which determines the delay time, is left unchanged if the resistance R is multiplied by "a" and the capacitance C is multiplied by 1/a. If the off-chip driver 5 in the dummy circuit is formed by scaling the off-chip driver 3 in the real circuit as described above, it is possible to suppress the power consumption without changing the amplitude level of the signal voltage and the delay time.

A fourth embodiment of the present invention will now be described with reference to FIG. 10. The fourth embodiment is directed to the circuit construction for further decreasing the power consumption, compared with the third embodiment, of the off-chip drivers included in the real circuit and the dummy circuit of the synchronous signal generation circuit according to the first embodiment of the present invention.

In the circuit construction of the off-chip drivers 3 and 5 included in the real circuit and the dummy circuit, respectively, described previously in conjunction with FIGS. 9A and 9B, a penetration current flows between the power source voltages Vccq/2 and Vccq and between the power source voltages Vccq and Vssq so as to obtain a small amplitude output voltage Vout.

Figure 10:
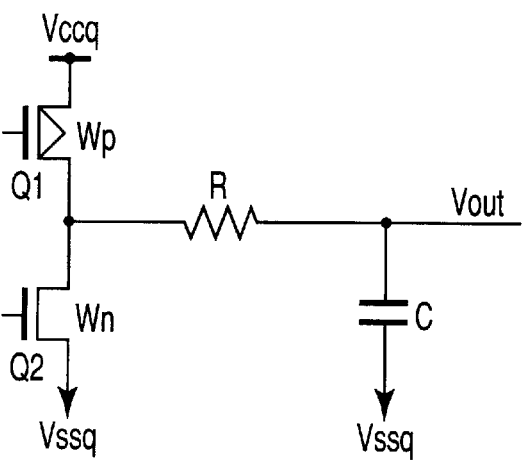
FIG. 10 shows another circuit construction of the off-chip driver included in the dummy circuit.

FIG. 10 shows the circuit prepared by removing the power source voltage Vccq/2 and the second resistor from the circuit shown in FIG. 9A for avoiding the penetration current. In this case, the power source of Vccq/2 is unnecessary and, at the same time, the penetration current through the CMOS inverter can be eliminated. In the circuit shown in FIG. 10, a large amplitude output voltage Vout of CMOS level is generated in place of a small amplitude output voltage. However, it is possible to compensate the shortening of the delay time in the input receiver 4 connected in the rear stage of the off-chip driver 5 in the dummy circuit by adjusting the value of R×C, i.e., the rising time constant or the gradient of the rise in the output voltage Vout, by selecting appropriately the values of the capacitance C and the resistance R.

It should also be noted that, in the circuit of the off-chip driver shown in FIG. 10, it is possible to apply the scaling of the third embodiment described in conjunction with FIGS. 9A and 9B. It follows that the power consumption can be further decreased by employing in combination the scaling for the third embodiment and the circuit construction for the fourth embodiment.

The present invention is not limited to the embodiments described above. For example, in the third embodiment described above, the off-chip driver in the real circuit was subjected to the scaling with the off-chip driver in the dummy circuit taken as an example. However, the entire dummy circuit can be subjected to the scaling from the real circuit if the input receiver is similarly subjected to the scaling.

Also, in the fourth embodiment described above, the rising in the output section of the off-chip driver included in the real circuit was made variable with the off-chip driver in the dummy circuit taken as an example. However, the delay time in the entire dummy circuit can be adjusted, if the rising in the output section of the input receiver is similarly made variable.

Also, each of the first to fourth embodiments of the present invention described above is directed to the circuit construction of the synchronous signal generation circuit based on a CMOS circuit. However, the basic circuit is not necessarily limited to the CMOS circuit. To be more specific, the technical idea of the present invention can also be applied to the synchronous signal generation circuit based on a complementary circuit formed of bipolar transistors or based on a Bi-CMOS circuit. Further, various other modifications can be achieved within the technical scope of the present invention.

As described above, according to the synchronous signal generation circuit of the present invention, the signal is inputted first to the off-chip driver and, then, to the input receiver in the dummy circuit so as to diminish the amplitude of the signal between the off-chip driver and the input receiver included in the dummy circuit and, thus, to conform with the signal level in the input and output sections of the input receiver and the off-chip driver included in the real circuit. It follows that it is possible to suppress to the minimum level the error in the delay time in the real circuit excluding the mirror-type synchronous circuit and the dummy circuit relative to the process dispersion. As a result, the synchronizing accuracy can be improved, making it possible to realize a high speed I/O.

It should also be noted that the power consumption of the synchronous signal generation circuit can be decreased by forming the off-chip driver of the dummy circuit by scaling the off-chip driver of the real circuit in accordance with the arrangement of the off-chip driver and the input receiver included in the dummy circuit of the present invention. Also, if the scaling method is employed in combination with the circuit construction that permits eliminating the penetration current of the CMOS inverter included in the off-chip driver, the circuit construction of the off-chip driver can be simplified and, at the same time, the number of power sources can be decreased, leading to further decrease of the power consumption.

Incidentally, it is quite unnecessary to worry about the problems, which may be brought about by the use of the synchronous signal generation circuit of the present invention, that the synchronizing speed may be lowered, that the circuit size may be enlarged, and that the control may be made complex.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous signal generation circuit for generating an internal clock signal in synchronism with an external clock signal having a predetermined period, comprising:
   a real circuit including a first input receiver for receiving said external clock, a mirror-type synchronous circuit, and a first off-chip driver for outputting said internal clock signal, which are connected in series; and
   a dummy circuit for determining a delay time in said mirror-type synchronous circuit, said dummy circuit including a second input receiver and a second off-chip driver coupled between said first input receiver and said mirror-type synchronous circuit;
   wherein an input portion of said second input receiver is connected to an output portion of said second off-chip driver in said dummy circuit.

2. The synchronous signal generation circuit according to claim 1, wherein voltage amplitudes of input signals to said first and second input receivers are equal to each other, voltage amplitudes of output signals of said first and second input receivers are equal to each other, voltage amplitudes of input signals to said first and second off-chip drivers are equal to each other, and voltage amplitudes of output signals from said first and second off-chip drivers are equal to each other.

3. The synchronous signal generation circuit according to claim 2, wherein said voltage amplitudes of input signals to said first and second input receivers are smaller than said voltage amplitudes of output signals from said first and second input receivers.

4. The synchronous signal generation circuit according to claim 2, wherein said voltage amplitudes of input signals to said first and second off-chip drivers are larger than said voltage amplitudes of output signals from said first and second off-chip drivers.

5. The synchronous signal generation circuit according to claim 2, wherein said voltage amplitudes of input signals to said first and second input receivers are smaller than said voltage amplitudes of output signals from said first and second input receivers, and said voltage amplitudes of input signals to said first and second off-chip drivers are larger than said voltage amplitudes of output signals from said first and second off-chip drivers.

6. The synchronous signal generation circuit according to claim 1, wherein said first and second input receivers are identical to each other in the method of connecting circuit elements, and said first and second off-chip drivers are identical to each other in the method of connecting circuit elements.

7. The synchronous signal generation circuit according to claim 1, wherein a gradient of an output signal rise of said second input receiver is set optionally.

8. The synchronous signal generation circuit according to claim 1, wherein a gradient of an output signal rise of said second off-chip driver is set optionally.

9. The synchronous signal generation circuit according to claim 1, wherein a gradient of an output signal rise of said second input receiver is set optionally, and a gradient of an output signal rise of said second off-chip driver is set optionally.

10. The synchronous signal generation circuit according to claim 1, wherein said first off-chip driver in said real circuit comprises a circuit including at least a p-channel transistor having a gate width wpr, an n-channel transistor having a gate width Wnr, a resistor having a resistance Rr, and a capacitor having a capacitance Cr, and said second off-chip driver in said dummy circuit comprises a circuit including a p-channel transistor having a gate width Wpd, an n-channel transistor having a gate width Wnd, a resistor having a resistance Rd, and a capacitor having a capacitance Cd, wherein said circuits are constructed to meet relationships Wpd=wpr/a, Wnd=Wnr/a, Rd=Rrxa, and Cd=Cr/a, where a scaling ratio "a" is larger than 1, i.e., a>1.

11. The synchronous signal generation circuit according to claim 1, wherein:
   each of said first and second off-chip drivers comprises a p-channel transistor, an n-channel transistor, a first resistor, a second resistor, and a capacitor,
   a first power source voltage is imparted to a source of said p-channel transistor, a drain of said p-channel transistor is connected to a drain of said n-channel transistor, a second power source voltage is imparted to a source of said n-channel transistor, said drains of said p-channel transistor and said n-channel transistor, which are connected to each other, are connected to one terminal of said first resistor, the other terminal of said first resistor is connected to one terminal of said second resistor, a voltage that is a half of said first power source voltage is imparted to the other terminal of said second resistor, a connection point between the said other terminal of said first resistor and said one terminal of said second resistor is connected to one terminal of said capacitor, and a second power source voltage is imparted to the other terminal of said capacitor,
   each of said first and second off-chip drivers comprises an input section comprising a gate of said p-channel transistor and a gate of said n-channel transistor and an output section including said connection point of the said other terminal of said first resistor, said one terminal of said second resistor, and said one terminal of said capacitor, and
   each of said first and second off-chip drivers is constructed to meet relationships Wpd=Wpr/a, Wnd=Wnr/a, Rd=Rrxa, and Cd=Cr/a, where Wpr represents a gate width of said p-channel transistor included in said first off-chip driver, Wnr represents a gate width of said n-channel transistor included in said first off-chip driver, Rr represents a resistance of each of said first and second resistors included in said first off-chip driver, Cr represents a capacitance of said capacitor included in said first off-chip driver, Wpd represents a gate width of said p-channel transistor included in said second off-chip driver, Wnd represents a gate width of said n-channel transistor included in said second off-chip driver, Rd represents a resistance of each of said first and second resistors included in said second off-chip driver, Cd represents a capacitance of said capacitor included in said second off-chip driver, and a scaling ratio "a" is larger than 1, i.e., a>1.

12. The synchronous signal generation circuit according to claim 1, wherein:
   each of said first and second off-chip drivers comprises a p-channel transistor, an n-channel transistor, a resistor and a capacitor,
   a first power source voltage is imparted to a source of said p-channel transistor, a drain of said p-channel transistor is connected to a drain of said n-channel transistor, a second power source voltage is imparted to a source of said n-channel transistor, said drains of said p-channel transistor and said n-channel transistor, which are connected to each other, are connected to one terminal of said resistor, the other terminal of said resistor is connected to one terminal of said capacitor, and said second power source voltage is imparted to the other terminal of said capacitor,
   each of said first and second off-chip drivers comprises an input section including a gate of said p-channel transistor and a gate of said n-channel transistor, and an output section including a connection point of the said other terminal of said resistor and said one terminal of said capacitor, and
   each of said first and second off-chip drivers is constructed to meet relationships Wpd=Wpr/a, Wnd=Wnr/a, Rd=Rrxa, and Cd=Cr/a, where wpr represents a gate width of said p-channel transistor included in said first off-chip driver, Wnr represents a gate width of said n-channel transistor included in said first off-chip driver, Rr represents a resistance of said resistor included in said first off-chip driver, Cr represents a capacitance of said capacitor included in said first off-chip driver, Wpd represents a gate width of said p-channel transistor included in said second off-chip driver, Wnd represents a gate width of said n-channel transistor included in said second off-chip driver, Rd represents a resistance of said resistor included in said second off-chip driver, Cd represents a capacitance of said capacitor included in said second off-chip driver, and a scaling ratio "a" is larger than 1, i.e., a>1.

13. A synchronous signal generation circuit for generating an internal clock signal in synchronism with an external clock signal having a predetermined period, comprising;
   a real circuit including a first input receiver for receiving said external clock signal, a mirror-type synchronous circuit, and a first off-chip driver for outputting said internal clock signal, which are coupled in series; and
   a dummy circuit including a second input receiver and a second off-chip driver coupled between said first input receiver and said mirror-type synchronous circuit,
   wherein an input portion of said second input receiver is coupled to an output portion of said second off-chip driver in said dummy circuit, and said internal clock signal in synchronism with said external clock signal is generated by using a delay time of said mirror-type synchronous circuit, said delay time is determined to satisfy a condition where a sum of delay times of said dummy circuit and said mirror-type synchronous circuit is equal to an integer multiple of said predetermined period.

14. The synchronous signal generation circuit according to claim 13, wherein voltage amplitudes of input signals to said first and second input receivers are equal to each other, voltage amplitudes of output signals of said first and second input receivers are equal to each other, voltage amplitudes of input signals to said first and second off-chip drivers are equal to each other, and voltage amplitudes of output signals from said first and second off-chip drivers are equal to each other.

15. The synchronous signal generation circuit according to claim 14, wherein said voltage amplitudes of input signals to said first and second input receivers are smaller than said voltage amplitudes of output signals from said first and second input receivers.

16. The synchronous signal generation circuit according to claim 14, wherein said voltage amplitudes of input signals to said first and second off-chip drivers are larger than said voltage amplitudes of output signals from said first and second off-chip drivers.

17. The synchronous signal generation circuit according to claim 14, wherein said voltage amplitudes of input signals to said first and second input receivers are smaller than said voltage amplitudes of output signals from said first and second input receivers, and said voltage amplitudes of input signals to said first and second off-chip drivers are larger than said voltage amplitudes of output signals from said first and second off-chip drivers.

18. The synchronous generation circuit according to claim 13, wherein said first and second input receivers are identical to each other in the method of connecting circuit elements, and said first and second off-chip drivers are identical to each other in the method of connecting circuit elements.

19. The synchronous signal generation circuit according to claim 13, wherein a gradient of an output signal rise of said second input receiver is set optionally.

20. The synchronous signal generation circuit according to claim 13, wherein a gradient of an output signal rise of said second off-chip driver is set optionally.

21. The synchronous signal generation circuit according to claim 13, wherein a gradient of an output signal rise of said second input receiver is set optionally, and a gradient of an output signal rise of said second off-chip driver is set optionally.

22. The synchronous signal generation circuit according to claim 13, wherein said first off-chip driver in said real circuit comprises a circuit including at least a p-channel transistor having a gate width Wpr, an n-channel transistor having a gate width Wnr, a resistor having a resistance Rr, and a capacitor having a capacitance Cr, and said second off-chip driver in said dummy circuit comprises a circuit including a p-channel transistor having a gate width Wpd, an n-channel transistor having a gate width Wnd, a resistor having a resistance Rd, and a capacitor having a capacitance Cd, wherein said circuits are constructed to meet relationships Wpd=Wpr/a, Wnd=Wnr/a, Rd=Rr×a, Cd=Cr/a, where a scaling ratio "a" is larger than 1, i.e., a>1.

23. The synchronous signal generation circuit according to claim 13, wherein: each of said first and second off-chip drivers comprises a p-channel transistor, an n-channel transistor, a first resistor, a second resistor, and a capacitor, a first power source voltage is imparted to a source of said p-channel transistor, a drain of said p-channel transistor is connected to a drain of said n-channel transistor, a second power source voltage is imparted to a source of said n-channel transistor, said drain of said p-channel transistor and said n-channel transistor, which are connected to each other, are connected to one terminal of said first resistor, the other terminal of said first resistor is connected to one terminal of said second resistor, a voltage that is a half of said first power source voltage is imparted to the other terminal of said second resistor, a connection point between the said other terminal of said first resistor and said one terminal of said second resistor is connected to one terminal of said capacitor, and a second power source voltage is imparted to the other terminal of said capacitor, each of said first and second off-chip drivers comprises an input section comprising a gate of said p-channel transistor and a gate of said n-channel transistor and an output section including said connection point of the said other terminal of said first resistor, said one terminal of said second resistor, and said one terminal of said capacitor, and each of said first and second off-chip drivers is constructed to meet relationships Wpr=Wpr/a, Wnd=Wnr/a, Rd=Rr×a, and Cd=Cr/a, where Wpr represents a gate width of said p-channel transistor included in said first off-chip driver, Wnr represents a gate width of said n-channel transistor included in said first off-chip driver, Rr represents a resistance of each of said first and second resistors included in said first off-chip driver, Cr represents a capacitance of said capacitor included in said first off-chip driver, Wpd represents a gate width of said p-channel transistor included in said second off-chip driver, Wnd represents a gate width of said n-channel transistor included in said second off-chip driver, Rd represents a resistance of each of said first and second resistors included in said second off-chip driver, Cd represents a capacitance of said capacitor included in said second off-chip driver, and a scaling ratio "a" is larger than 1, i.e., a>1.

24. The synchronous signal generation circuit according to claim 13 wherein:

each of said first and second off-chip drivers comprises a p-channel transistor, an n-channel transistor, a resistor and a capacitor, a first power source voltage is imparted to a source of said p-channel transistor, a drain of said p-channel transistor is connected to a drain of said n-channel transistor, a second power source voltage is imparted to a source of said n-channel transistor, said drains of said p-channel transistor and said n-channel transistor, which are connected to each other, are connected to one terminal of said resistor, the other terminal of said resistor is connected to one terminal of said capacitor, and said second power source voltage is imparted to the other terminal of said capacitor, each of said first and second off-chip drivers comprises an input section including a gate of said p-channel transistor and a gate of said n-channel transistor, and an output section including a connection point of the said other terminal of said resistor and said one terminal of said capacitor, and each of said first and second off-chip drivers is constructed to meet relationships Wpd=Wpr/a, Wnd=Wnr/a, Rd=Rr×a, and Cd=Cr/a, where Wpr represents a gate width of said p-channel transistor included in said first off-chip driver, Wnr represents a gate width of said n-channel transistor included in said first off-chip driver, Rr represents a resistance of said resistor included in said first off-chip driver, Cr represents a capacitance of said capacitor included in said first off-chip driver, Wpd represents a gate width of said p-channel transistor included in said second off-chip driver, Wnd represents a gate width of said n-channel transistor included in said second off-chip driver, Rd represents a resistance of said resistor included in said second off-chip driver, Cd represents a capacitance of said capacitor included in said second off-chip driver, and scaling ratio "a" is larger than 1, i.e., a>1.

* * * * *

UNITED STATES PATENT AND TRADEMARK OFFICE
CERTIFICATE OF CORRECTION

PATENT NO.    : 6,337,834 B1
DATED         : January 8, 2002
INVENTOR(S)   : Katsuaki Isobe et al.

It is certified that error appears in the above-identified patent and that said Letters Patent is hereby corrected as shown below:

<u>Title page,</u>
Item [73], Assignee, insert -- Fujitsu Limited, Kawasaki (JP) --.

Signed and Sealed this

Twenty-fifth Day of March, 2003

JAMES E. ROGAN
*Director of the United States Patent and Trademark Office*